United States Patent [19]

Lee

[11] Patent Number: 5,450,014
[45] Date of Patent: Sep. 12, 1995

[54] TEST APPARATUS FOR DETECTING REVERSE INSERTION OF A CAPACITOR ON A TEST BOARD

[75] Inventor: Jea C. Lee, Kyungki, Rep. of Korea

[73] Assignee: LG Industrial Systems Co., Ltd., Seoul, Rep. of Korea

[21] Appl. No.: 157,569

[22] Filed: Nov. 26, 1993

[30] Foreign Application Priority Data

Dec. 1, 1992 [KR] Rep. of Korea ............... 1992-22992

[51] Int. Cl.⁶ ............................................. G01R 27/26
[52] U.S. Cl. .................................. 324/548; 324/678; 209/574
[58] Field of Search ............... 324/548, 658, 678, 679, 324/690; 340/653; 209/574

[56] References Cited

U.S. PATENT DOCUMENTS

| | | | |
|---|---|---|---|
| 4,728,931 | 3/1988 | Linder et al. | 324/678 |
| 4,748,401 | 5/1988 | Aldinger | 324/548 |
| 4,779,040 | 10/1988 | Aldinger | 324/548 |
| 5,343,157 | 8/1994 | Deschamps | 324/678 |

Primary Examiner—Kenneth A. Wieder
Assistant Examiner—Christopher M. Tobin
Attorney, Agent, or Firm—Oliff & Berridge

[57] ABSTRACT

An in-circuit test apparatus includes a constant voltage source that supplies constant voltages and a current amplification circuit that outputs a constant current based on the constant voltages. A switch transfers the constant current from the current amplification circuit to an inversion amplifier that inversion-amplifies the constant current transferred by the switch. Additionally, a relay circuit transfers the inversion-amplified signal to a test board having a capacitor inserted into the test board. The capacitor charges with the constant current transferred by the relay circuit for a predetermined time period. A voltage follower amplifies the charging voltages on the capacitor to prevent the charging voltage from being discharged due to an internal resistance of the capacitor. Further, a comparison circuit compares the charging voltage on the capacitor with a reference voltage to sense the capacitance of the capacitor and to sense reverse insertion of the capacitor. A buffer buffers an output signal from the comparison circuit and a microprocessor senses the capacitance and reverse insertion of the capacitor in response to an output signal from the buffer.

5 Claims, 3 Drawing Sheets

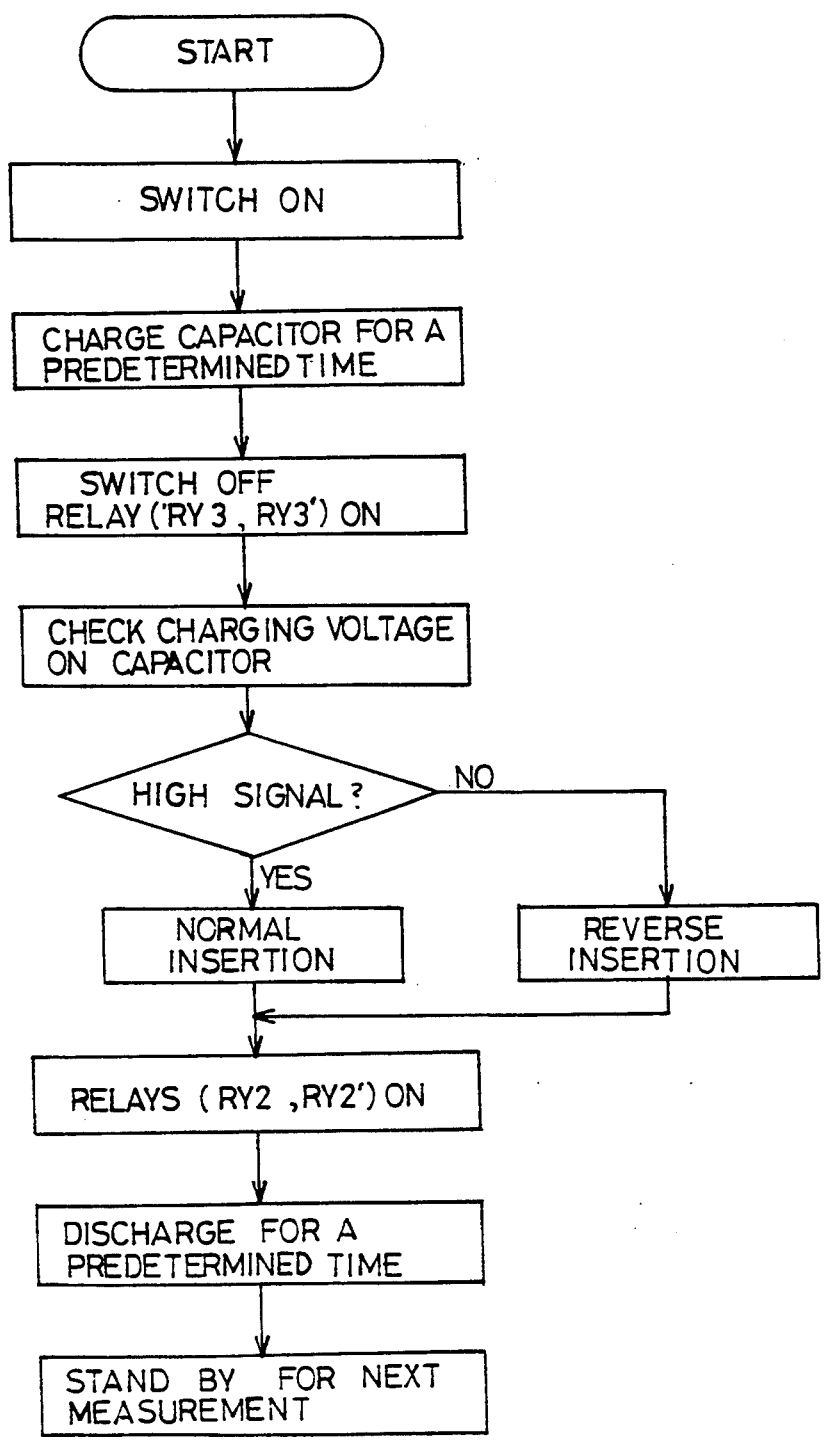

TEST APPARATUS FOR DETECTING REVERSE INSERTION OF A CAPACITOR ON A TEST BOARD

BACKGROUND OF THE INVENTION

1. Field of the Invention

The present invention relates in general to in-circuit test apparatus, and more particularly to an in-circuit test apparatus for detecting reverse insertion of capacitors into a PCB board to prevent a faulty operation of a circuit.

2. Description of the Prior Art

Referring to FIG. 1, there is shown a block diagram of a conventional in-circuit test apparatus. As shown in this drawing, the conventional in-circuit test apparatus comprises a constant current source 1 for supplying a constant current I1, a relay circuit 2 for transferring the constant current I1 from the constant current source 1, and a test board 3. Capacitors C1 and C2 are inserted into the test board 3 and charge with the constant current I1 transferred by the relay circuit 2.

A voltage follower 4 is provided in the conventional in-circuit test apparatus to amplify charging voltages V1 and V2 on the capacitors C1 and C2 to prevent the charging voltages V1 and V2 from being discharged due to internal resistances of the capacitors C1 and C2 according to a state of the relay circuit 2.

The conventional in-circuit test apparatus also comprises an amplifier 5 for amplifying an output voltage from the voltage follower 4, a sample/holder 6 for sampling an output voltage from the amplifier 5 at a predetermined period and holding the sampled voltage, an analog/digital (A/D) converter 7 for converting an output voltage from the sample/holder 6 into a digital signal, and a microprocessor 8 for sensing capacitances of the capacitors C1 and C2 in response to the digital signal from the A/D converter 7.

The relay circuit 2 includes a relay RY1 for transferring the constant current I1 from the constant current source 1 to the capacitors C1 and 02 and relays RY2 and RY2' for switching the constant current I1 which is transferred from the relay RY1 to the capacitots C1 and C2, to charge the constant current I on the capacitors C1 and C2.

The operation of the conventional in-circuit test apparatus with the above-mentioned construction will hereinafter be described.

First, the operation of sensing the capacitance of the capacitor C1 normally inserted into the test board 3 will be mentioned.

The constant current I1 is supplied from the constant current source 1 and the relays RY1 and RY2 in the relay circuit 2 are turned on. In this case, the constant current I1 from the constant current source 1 is transferred to the capacitor C1 in the test board 3 by the relay RY1. The transferred constant current I1 is charged on the capacitor C1 for a predetermined time period. The charging voltage V1 on the capacitor C1 can be expressed by the following equation:

$$V1 = (I1 \times T)/C1$$

At that time that the charging of the capacitor C1 is completed, the relay RY1 in the relay circuit 2 is turned off and the charging voltage V1 on the capacitor C1 is then amplified by the voltage follower 4. The output voltage from the voltage follower 4 is amplified by a predetermined level by the amplifier 5 and then applied to the sample/holder 6. The sample/holder 6 samples the output voltage from the amplifier 5 at the predetermined period and holds the sampled voltage.

The output voltage from the sample/holder 6 is converted into the digital signal by the A/D converter 7 and then applied to the microprocessor 8. In response to the digital signal from the A/D converter 7, the microprocessor 8 senses the capacitance of the capacitor C1.

Then the operation of sensing the capacitance of the capacitor C2 reversely inserted into the test board 3 will be mentioned.

In a similar manner to that in the operation of sensing the capacitance of the capacitor C1, the constant current I1 is supplied from the constant current source 1 and the relays RY1 and RY2' in the relay circuit 2 are turned on. As a result, the constant current II from the constant current source 1 is transferred to the capacitor C2 in the test board 3 by the relay RY1. The transferred constant current I1 is charged on the capacitor C2 for the predetermined time period. The charging voltage V2 on the capacitor C2 can be expressed by the following equation:

$$V2 = (I1 \times T)C2$$

When the charging of the capacitor C2 is completed, the relay RY1 in the relay circuit 2 is turned off and the charging voltage V2 on the capacitor C2 is then amplified by the voltage follower 4. The output voltage from the voltage follower 4 is amplified by the predetermined level by the amplifier 5 and then applied to the sample/holder 6. The sample/holder 6 samples the output voltage from the amplifier 5 at the predetermined period and holds the sampled voltage.

The output voltage from the sample/holder 6 is converted into the digital signal by the A/D converter 7 and then applied to the microprocessor 8. In response to the digital signal from the A/D converter 7, the microprocessor 8 senses the capacitance of the capacitor C2.

However, the conventional in-circuit test apparatus has a disadvantage in that only the capacitances of the capacitors (for example, electrolytic) are sensed regardless of the normal or reverse insertion into the test board. That is, the conventional in-circuit test apparatus fails to detect whether capacitors have been inserted in a test board with a correct polarization or an incorrect polarization. The condition of a capacitor being inserted on a test board with an incorrect polarization will hereafter be referred to as reverse insertion. In the case where a circuit is operated for a long time under the condition that the capacitor remains at its reverse insertion state, components of the circuit may be subjected to a damage, resulting in a faulty operation of the circuit. The faulty operation of the circuit exerts a bad influence on the associated equipments.

SUMMARY OF THE INVENTION

Therefore, the present invention has been made in view of the above problems. It is an object of the present invention to provide an in-circuit test apparatus in which charging voltages on capacitots are detected so that normal and reverse insertion of the capacitors into a PCB board can be detected to prevent a faulty operation of a circuit.

In accordance with the present invention, the above and other objects can be accomplished by an in-circuit test apparatus comprising constant voltage means for supplying constant voltages; current amplification means for outputting a constant current according to the constant voltages from said constant voltage means; switching means for transferring the constant current from said current amplification means; inversion amplification means for inversion-amplifying the constant current transferred by said switching means; relay means for transferring the constant current inversion-amplified by said inversion amplification means; a test board having capacitors inserted into said test board and charging with the constant current transferred by said relay means for a predetermined time period; voltage follower means for amplifying charging voltages on the capacitors to prevent the charging voltages from being discharged due to internal resistances of the capacitors; comparison means for comparing the charging voltages on the capacitors with a reference voltage respectively to sense capacitances of the capacitors and sense reverse insertion of the capacitors according to the sensed capacitances; buffering means for buffering an output signal from said comparison means; and control means for sensing the capacitances and reverse insertion of the capacitors in response to an output signal from said buffering means.

BRIEF DESCRIPTION OF THE DRAWINGS

The above and other objects, features and advantages of the present invention will be more clearly understood from the following detailed description taken in conjunction with the accompanying drawings, in which:

FIG. 3 is a flowchart illustrating an operation of the in-circuit test apparatus in FIG. 2.

DETAILED DESCRIPTION OF THE PREFERRED EMBODIMENTS

Figure 1:
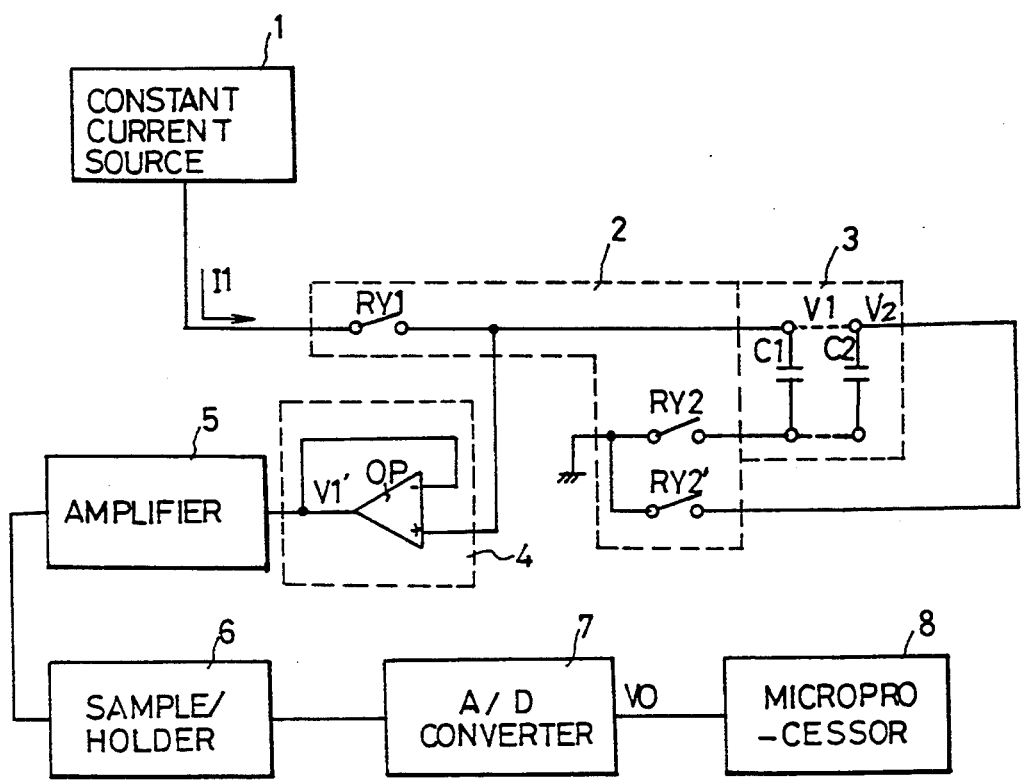
FIG. 1 is a block diagram of a conventional in-circuit test apparatus.
Figure 2:
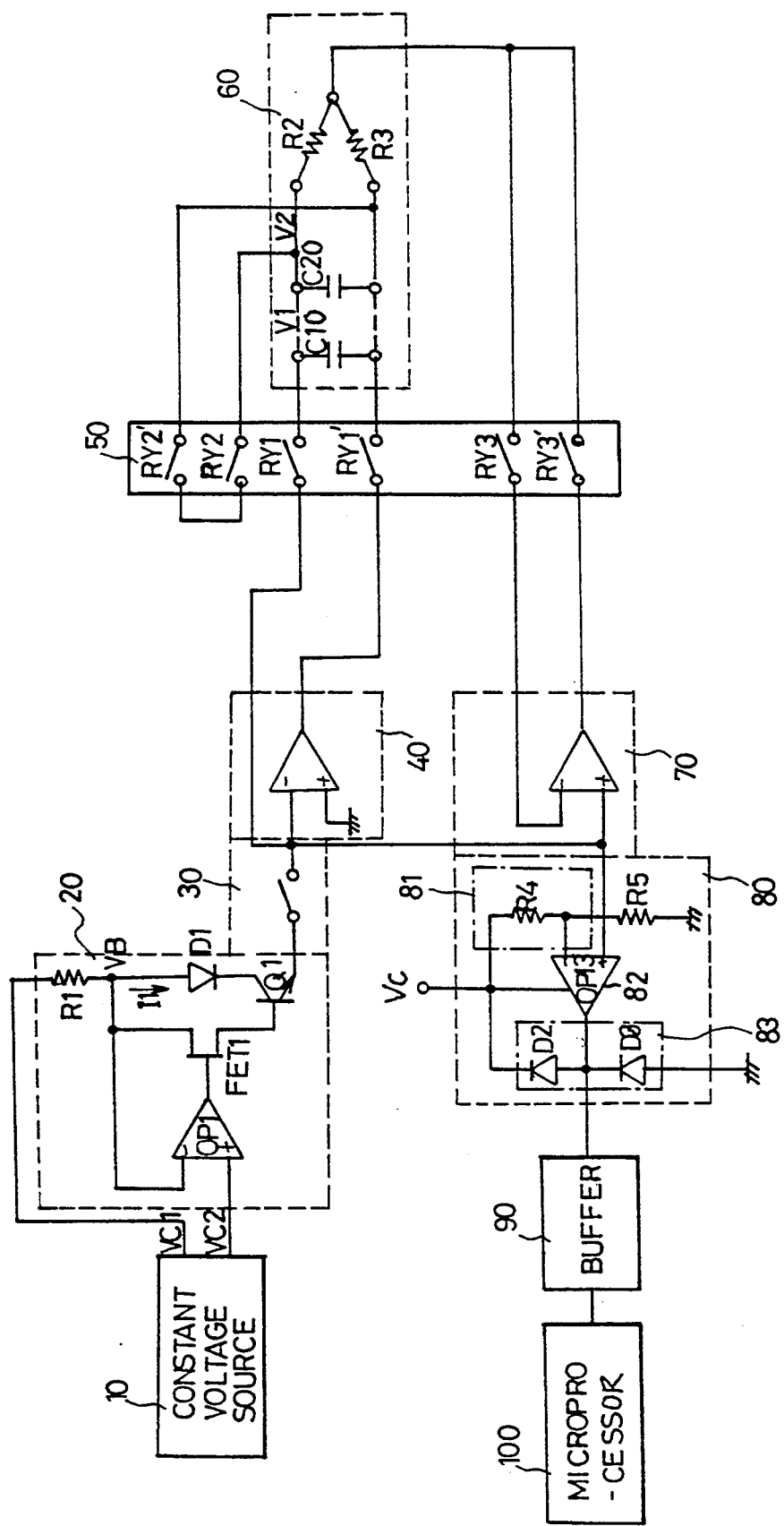
FIG. 2 is a block diagram of an in-circuit test apparatus in accordance with the present invention.

Referring to FIG. 2, there is shown a block diagram of an in-circuit test apparatus in accordance with the present invention. As shown in this drawing, the in-circuit test apparatus comprises a constant voltage source 10 for supplying constant voltages Vc1 and Vc2, a current amplification circuit 20 for outputting a constant current I1 according to the constant voltages Vc1 and Vc2 from the constant voltage source 10, a switch 30 for transferring the constant current I1 from the current amplification circuit 20, an inversion amplifier 40 for inversion-amplifying the constant current I1 transferred by the switch 30, a relay circuit 50 for transferring the constant current I1 inversion-amplified by the inversion-amplifier 40, and a test board 60. Capacitors C10 and C20 are inserted into the test board 60 and charge with the constant current I1 transferred by the relay circuit 50 for a predetermined time period.

A voltage follower 70 is provided in the in-circuit test apparatus to amplify charging voltages V1 and V2 on the capacitors C10 and C20 to prevent the charging voltages V1 and V2 from being discharged due to internal resistances of the capacitors C10 and C20.

A comparison circuit 80 is also provided in the in-circuit test apparatus to compare the charging voltages V1 and V2 on the capacitors C10 and C20 with a reference voltage Vr respectively to sense capacitances of the capacitors C10 and C20 and sense reverse insertion of the capacitors C10 and C20 according to the sensed capacitances.

The in-circuit test apparatus also comprises a buffer 90 for buffering an output signal from the comparison circuit 80, and a microprocessor 100 for sensing the capacitances and reverse insertion of the capacitors C10 and C20 in response to an output signal from the buffer 90.

The current amplification circuit 20 includes an amplifier OP1 for inputting the constant voltage Vc1 from the constant voltage source 10 dropped by a resistor R1 at its inverting input terminal (−) and the constant voltage Vc2 from the constant voltage source 10 at its non-inverting input terminal (+), a field effect transistor FET1 for performing a switching operation in response to an output signal from the amplifier CP1 to transfer the constant voltage Vc1 from the constant voltage source 10 dropped by the resistor R1 from its source to its drain, a diode D1 for converting the constant voltage vc1 from the constant voltage source 10 dropped by the resistor R1 into the constant current I1, and a transistor Q1 for performing a switching operation in response to an output voltage from the drain of the field effect transistor FET1 to transfer the constant current I1 from the diode D1 from its collector to its emitter.

The switch 30 may typically include a relay.

The comparison circuit 80 includes a voltage divider 81 for dividing an input voltage Vc to output the reference voltage Vr. The voltage divider 81 is provided with resistors R4 and R5.

Also, the comparison circuit 80 includes a comparator 82 for comparing the charging voltages V1 and V2 on the capacitors C10 and C20 with the reference voltage Vr from the voltage divider 81 respectively. The comparator 82 outputs a high signal if either of the charging voltages V1 and V2 on the capacitors C10 and C20 is higher than the reference voltage Vr from the voltage divider 81 and outputs a low signal if either of the charging voltages V1 and V2 are not higher than the reference voltage $V_r$. The comparsion circuit 80 may also include a clamping circuit 83 for clamping an output signal from the comparator 82.

The inversion amplifier 40 and the voltage follower 70 may include typical amplifiers, respectively. The relay circuit 50 includes a plurality of relays RY1–RY3 and RY1′–RY3′. The reference numeral s R2 and R3, not described, designate internal resistors of the capacitors C10 and C20.

The operation of the in-circuit test apparatus with the above-mentioned construction in accordance with the present invention will hereinafter be described in detail with reference to FIGS. 2 and 3.

First, the operation of testing the normal insertion of the capacitor C10 into the test board 60 will hereinafter be described. It is understood that capacitor C10 and C20 are examples of a correct polarization and an incorrect polarization, respectively. For ease of illustration, the capacitors C10 and C20 are described separately.

First, the constant voltages Vc1 and Vc2 are supplied from the constant voltage source 10. In the current amplification circuit 20, the constant voltage Vc1 from the constant voltage source 10 is dropped by the resistor R1 and then applied to the source of the field effect transistor FET1, an anode of the diode D1 and the inverting input terminal (−) of the amplifier OP1. The constant voltage Vc2 from the constant voltage source 10 is applied to the non-inverting input terminal (+) of the amplifier OP1.

At this time, a low signal is outputted from the amplifier OP1 because the constant voltage Vc1 through resistor R1 is higher than the constant voltage Vc2. In response to the low signal from the amplifier OP1, the field effect transistor FET1 is turned on, thereby causing the constant voltage Vc1 dropped by the resistor R1 to be transferred from the source of the field effect transistor FET1 to the drain thereof and then to a base of the transistor Q1. As a result, the transistor Q1 is turned on.

Upon the turning-on of the transistor Q1 the constant current I1 from the diode D1 is transferred from the collector of the transistor Q1 to the emitter.

Noticeably, the field effect transistor FET1 and the transistor Q1 function as current busters to prevent a thermal runaway of the amplifier OP1. The constant current I1 from the emitter of the transistor Q1 can be expressed by the following equation:

$$I1 = (Vc1 - Vb)/R1$$

where, Vb is the constant vol rage Vc1 dropped by the resistor R1.

For example, if the constant current I1 from the emitter of the transistor Q1 is 10mA and the constant voltage Vc1 from the constant voltage source 10 is +5 V, the resistor R1 is 250Ω.

The constant current I1 from the emitter of the transistor Q1 is transferred to an inverting input terminal (−) of the inversion amplifier 40 through the switch 30. The transferred constant current I1 is applied to the capacitor C10 through the relays RY1 and RY1' in the relay circuit 50 to charged the capacitor C10 for the predetermined time period. The charging voltage V1 on the capacitor C10 can be expressed by the following equation:

$$V1 = (I1 \times T)/C10$$

The charging time T is about 100–300 msec although it is varied according to the capacitance of the capacitor C10. When the charging of the capacitor C10 is completed with the lapse of the charging time T, the switch 30 is turned off, thereby causing the charging voltage V1 on the capacitor C10 to be held by the inversion amplifier 40.

In other words, when the switch 30 is turned on, the output from the switch 30 is applied to relay RY1 as well as the inverting terminal of the inverting amplifier 40. The inverting amplifier 40 outputs a negative level signal to the relay RY1' because the level of the input signal to the inverting terminal is higher than the level of the input signal to the non-inverting terminal in the inverting amplifier 40. As a result, the correctly polarized capacitor C10 is charged with the positive level signal to the positive electrode and negative level signal to the negative electrode of the capacitor C10.

Also, the charging voltage V1 on the capacitor C10 is dropped by the internal resistors R2 and R3 of the capacitor C10 and then applied to an inverting input terminal (−) of the voltage follower 70 through the relays RY3' and RY3' in the relay circuit 50. The voltage from the switch 30 is also applied to a non-inverting input terminal (+) of the voltage follower 70. As a result, the voltage dropped by the internal resistors R2 and R3 is amplified by the voltage follower 70. This amplification of the voltage follower 70 maintains the charging voltage V1 on the capacitor C10 naturally. The internal resistors R2 and R3 are equivalent expressions of the electrical relationship between the capacitor to be tested and neighboring components. The voltage follower 70 prevents the charged voltage in the comparators from being discharged by an influence from neighboring components.

On the other hand, in the comparison circuit 80, the voltage Vc is divided by the resistors R4 and R5 and then applied to the inverting input terminal (−) of the comparator 82, the non-inverting input terminal (+) of which is applied with the charging voltage V1 on the capacitor C10. The comparator 82 compares the inputted voltages with each other and outputs the high or low signal in accordance with the compared result.

In this case, the comparator 82 outputs the high signal because the divided voltage is lower than the charging voltage V1 on the capacitor C10.

The high signal from the comparator 82 is clamped by diodes D2 and D3 in the clamping circuit 83 and then applied through the buffer 90 to the microprocessor 100. In response to the output signal from the buffer 90, the microprocessor 100 discriminates the normal insertion of the capacitor C10.

At that time that the normal insertion of the capacitor C10 is discriminated, the charging voltage V1 on the capacitor C10 is discharged through the relays RY2 and RY2' in the relay circuit 50. Then, the operation gets ready to test the subsequent capacitor C20.

Then, the operation of testing the reverse insertion of the capacitor C20 into the test board 60 will hereinafter be described.

In the same manner as that in the operation of testing the normal insertion of the capacitor C20 into the test board 60, the constant voltages Vc1 and Vc2 are supplied from the constant voltage source 10 and the resultant constant current I1 is transferred to the capacitor C20 on the test board 60 through the switch 30, the inversion amplifier 40 and the relay circuit 50. The transferred constant current I1 is charged on the capacitor C20 for the predetermined time period. As explained above, capacitor C20 is shown to explain the operation of the present invention with incorrect polarization. If capacitor C20 is improper polarized, it is charged with a positive level signal applied to its negative electrode through relay RY1 and a negative level signal applied to its positive electrode through relay RY1'. When the switch 30 is turned OFF, the capacitor C20 is instantaneously discharged due to the negative level signal applied to its positive electrode.

At this time, the switch 30 is turned off, thereby causing the charging voltage V2 on the capacitor C20 to be applied to the inverting input terminal (−) of the inversion amplifier 40. As a result, the charging voltage V2 on the capacitor C20 is instantaneously discharged. Also, the charging voltage V2 on the capacitor C20 is applied to the non-inverting input terminal (+) of the comparator 82, the inverting input terminal (−) of which is applied with the voltage divided by the resistors R4 and R5.

The comparator 82 compares the inputted voltages with each other and outputs the high or low signal in accordance with the compared result. In this case, the charging voltage V2 on the capacitor C20 is lower than the divided voltage because it was discharged. As a result, the comparator 82 outputs the low signal. The low signal from the comparator 82 is clamped by the diodes D2 and D3 in the clamping circuit 83 and then applied through the buffer 90 to the microprocessor 100. In response to the output signal from the buffer 90, the microprocessor 100 discriminates the reverse insertion of the capacitor C20.

As apparent from the above description, according to the present invention, the charging voltages on the capacitors are detected so that the normal and reverse insertion of the capacitors into the PCB board can be detected. Therefore, there is no necessity for checking polarities of the capacitors one by one. This has the effect of removing an inconvenience in the testing and reducing the time required in the testing.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for detecting reverse insertion of a capacitor on a test board, the apparatus comprising:
    constant voltage means for supplying constant voltages;
    current amplification means for outputting a constant current based on the constant voltages supplied from said constant voltage means;
    switching means for receiving the constant current from said current amplification means and for transferring the received constant current to inversion amplification means;
    the inversion amplification means for inversion-amplifying the constant current transferred by said switching means and producing an inversion amplified signal;
    relay means for transferring the inversion-amplified by said inversion amplification means; a test inversion amplified signal to the test board, the capacitor being inserted into said test board and charging with the inversion amplified signal for a predetermined time period;
    voltage follower means for amplifying a charging voltage on the capacitor to prevent the charging voltage from being discharged due to an internal resistance of the capacitor;
    comparison means for comparing the charging voltage on the capacitor with a reference voltage to sense a capacitance of the capacitor and to sense reverse insertion of the capacitor based on the sensed capacitance;
    buffering means for buffering an output signal from said comparison means; and
    control means for sensing the capacitance and the reverse insertion of the capacitor in the board based on an output signal from said buffering means.

2. An apparatus as set forth in claim 1, wherein said inversion amplification means includes:
    an amplifier for inversion-amplifying the charging voltage on the capacitor on said test board after said switching means is turned off.

3. An apparatus as set forth in claim 1, wherein said switching means includes:
    a relay for transferring the received constant current from said current amplification means to said inversion amplification means.

4. An apparatus as set forth in claim 1, wherein said voltage follower means includes:
    an amplifier for amplifying the charging voltage on the capacitor to prevent the charging voltage from being discharged due to the internal resistance of the capacitor.

5. An apparatus as set forth in claim 1, wherein said comparison means includes:
    voltage divider for dividing an input voltage to output the reference voltage;
    a comparator for comparing the charging voltages on the capacitors with the reference voltage from said voltage divider respectively and outputting a high signal if each of the charging voltages on the capacitors is higher than the reference voltage from said voltage divider and a low signal if not so; and
    a clamping circuit for clamping an output signal from said comparator.

* * * * *